(12) United States Patent
Jung et al.

(10) Patent No.: US 10,388,803 B2
(45) Date of Patent: Aug. 20, 2019

(54) COMPOSITION FOR FORMING SOLAR CELL ELECTRODE AND ELECTRODE MANUFACTURED THEREFROM

(71) Applicant: SAMSUNG SDI CO., LTD., Yongin-si, Gyeonggi-do (KR)

(72) Inventors: Seok Hyun Jung, Uiwang-si (KR); Dong Suk Kim, Uiwang-si (KR); Min Su Park, Uiwang-si (KR); Young Ki Park, Uiwang-si (KR); Koon Ho Kim, Uiwang-si (KR); Min Jae Kim, Uiwang-si (KR); SeakCheol Kim, Uiwang-si (KR); Yong Je Seo, Uiwang-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 106 days.

(21) Appl. No.: 14/761,215

(22) PCT Filed: Sep. 12, 2014

(86) PCT No.: PCT/KR2014/008510
§ 371 (c)(1),
(2) Date: Jul. 15, 2015

(87) PCT Pub. No.: WO2015/037933
PCT Pub. Date: Mar. 19, 2015

(65) Prior Publication Data
US 2016/0284891 A1    Sep. 29, 2016

(30) Foreign Application Priority Data

Sep. 13, 2013  (KR) .................. 10-2013-0110718

(51) Int. Cl.
| H01L 31/0224 | (2006.01) |
| C03C 8/18 | (2006.01) |
| C03C 4/14 | (2006.01) |
| C09D 5/24 | (2006.01) |
| H01B 1/16 | (2006.01) |
| H01B 1/22 | (2006.01) |

(52) U.S. Cl.
CPC ........ *H01L 31/022425* (2013.01); *C03C 4/14* (2013.01); *C03C 8/18* (2013.01); *C09D 5/24* (2013.01); *H01B 1/16* (2013.01); *H01B 1/22* (2013.01); *C03C 2204/00* (2013.01); *C03C 2207/00* (2013.01); *Y02E 10/50* (2013.01)

(58) Field of Classification Search
None
See application file for complete search history.

(56) References Cited

U.S. PATENT DOCUMENTS

| 4,945,071 | A | | 7/1990 | Friesen et al. | |
| 5,066,621 | A | * | 11/1991 | Akhtar | C03C 3/12 |
| | | | | | 106/1.14 |
| 5,188,990 | A | * | 2/1993 | Dumesnil | C03C 3/122 |
| | | | | | 106/1.14 |
| 5,334,558 | A | * | 8/1994 | Dietz | C03C 3/122 |
| | | | | | 106/1.14 |
| 2011/0232746 | A1 | * | 9/2011 | Carroll | B22F 1/0059 |
| | | | | | 136/256 |
| 2012/0142140 | A1 | * | 6/2012 | Li | H01L 31/022441 |
| | | | | | 438/98 |
| 2013/0068290 | A1 | | 3/2013 | Hang et al. | |
| 2013/0186463 | A1 | * | 7/2013 | Wang | C03C 8/12 |
| | | | | | 136/256 |
| 2013/0192671 | A1 | | 8/2013 | Hang et al. | |
| 2014/0120648 | A1 | * | 5/2014 | Machii | C03C 8/18 |
| | | | | | 438/57 |
| 2016/0049532 | A1 | * | 2/2016 | Sakai | H01B 1/22 |
| | | | | | 136/256 |
| 2016/0311721 | A1 | * | 10/2016 | Hwang | C03C 3/07 |

FOREIGN PATENT DOCUMENTS

| CN | 102194537 A | | 9/2011 | |
| CN | 102958861 A | | 3/2013 | |
| EP | 2 698 355 A1 | | 2/2014 | |
| EP | 2 703 368 A1 | | 3/2014 | |
| JP | 02-293344 A | | 12/1990 | |
| JP | 5-175254 A | | 7/1993 | |
| JP | 2010-184852 A | | 8/2010 | |
| JP | 2013-531863 A | | 8/2013 | |
| JP | 2014-049743 A | | 3/2014 | |
| JP | 2014-150015 | * | 8/2014 | |
| KR | 10-2001-0111214 A | | 12/2001 | |
| KR | 10-2010-0125273 A | | 11/2010 | |
| KR | 10-2011-0105682 A | | 9/2011 | |
| KR | 10-2013-0018344 A | | 2/2013 | |
| KR | 10-2013-0049008 A | | 5/2013 | |
| KR | 10-2013-0062191 A | | 6/2013 | |
| TW | 201245361 A | | 11/2012 | |
| WO | WO-9302980 A1 | * | 2/1993 | ............. C03C 3/122 |
| WO | WO 2011/140192 A1 | | 11/2011 | |

OTHER PUBLICATIONS

Chinese Office Action dated Aug. 16, 2016 in Corresponding Chinese Patent Application No. 201480004073.6.
Office Action dated Aug. 7, 2015 in corresponding Taiwanese Patent Application No. 103131531.
Jinsam Choi, et al., "Characteristics of the PbO—$Bi_2$—$O_3$—$B_2$—$O_3$—ZnO—$SiO_2$ Glass System Doped With Pb Metal Filler", Journal of the Korean Ceramic Society, vol. 50, No. 3, pp. 238-243, 2013.

(Continued)

*Primary Examiner* — Tanisha Diggs
(74) *Attorney, Agent, or Firm* — Lee & Morse, P.C.

(57) ABSTRACT

Disclosed herein is a composition for solar cell electrodes. The composition includes silver powder; glass frits; and an organic vehicle, wherein the glass frits have a glass transition temperature of about 100° C. to about 300° C. and exhibit an exothermic peak starting temperature of about 200° C. to about 400° C. on a DTA curve in TG-DTA analysis. Solar cell electrodes formed of the composition have high open circuit voltage and short circuit current density, thereby providing excellent conversion efficiency and fill factor.

6 Claims, 1 Drawing Sheet

(56) References Cited

OTHER PUBLICATIONS

Office Action dated Aug. 12, 2015 in corresponding Korean Patent Application No. 10-2013-0110718.
Extended European Search Report dated Dec. 23, 2016 in the corresponding European Patent Application No. 14844862.4.
Japanese Office Action dated Feb. 6, 2018 in the corresponding JP 2016-542642.

* cited by examiner

[Figure 1]
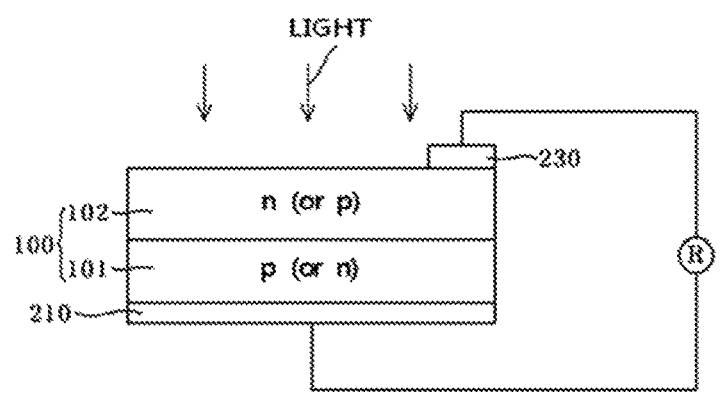
[Figure 2]
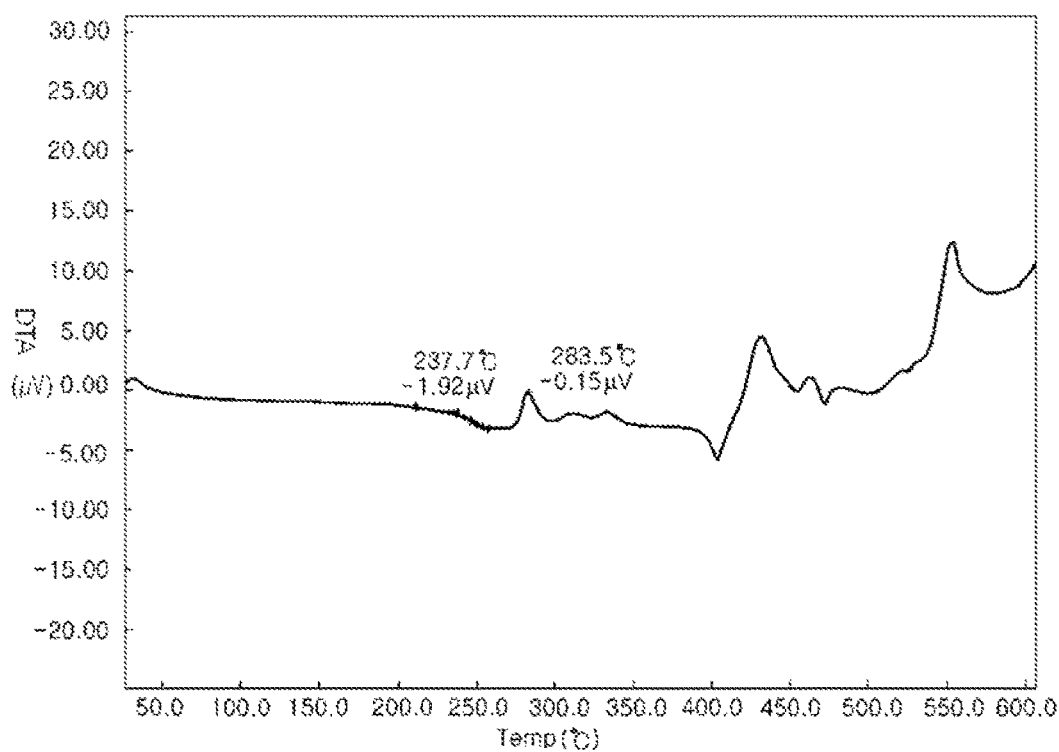

COMPOSITION FOR FORMING SOLAR CELL ELECTRODE AND ELECTRODE MANUFACTURED THEREFROM

CROSS REFERENCE TO RELATED APPLICATIONS

This is the U.S. national phase application based on PCT Application No. PCT/KR2014/008510, filed Sep. 12, 2014, which is based on Korean Patent Application No. 10-2013-0110718, filed Sep. 13, 2013, the entire contents of all of which are hereby incorporated by reference.

TECHNICAL FIELD

The present invention relates to a composition for solar cell electrodes, and electrodes fabricated using the same.

BACKGROUND ART

Solar cells generate electricity using the photovoltaic effect of a p-n junction which converts photons of sunlight into electricity. In the solar cell, front and rear electrodes are formed on upper and lower surfaces of a semiconductor wafer or substrate with the p-n junctions, respectively. Then, the photovoltaic effect at the p-n junction is induced by sunlight entering the semiconductor wafer and electrons generated by the photovoltaic effect at the p-n junction provide electric current to the outside through the electrodes. The electrodes of the solar cell are formed on the wafer by applying, patterning, and baking an electrode composition.

Parameters determining solar cell efficiency include open circuit voltage (Voc), short circuit current density (Jsc), and fill factor (F.F.). The open circuit voltage (Voc) is a potential difference between opposite ends of a solar cell when the solar cell is irradiated with light in an open circuit state, i.e. with infinite impedance applied thereto. For example, in a homo-junction solar cell, a maximum possible open circuit voltage is given by a difference in work function between a p-type semiconductor and an n-type semiconductor. Since the work function is determined by the band-gap of a semiconductor, use of a material having a high band-gap provides substantially high open circuit voltage. The short circuit current density (Jsc) is a reverse (negative) current density when the solar cell is irradiated with light in a short circuit state, i.e. without any external resistance. The short circuit current density preferentially depends upon the intensity and spectral distribution of incident light. However, under these conditions, the short circuit current density depends upon how effectively electrons and holes excited by light absorption are sent from the solar cell to an external circuit without recombining with each other and lost thereof. Here, loss of electrons and holes due to recombination occurs inside and/or at an interface between materials in the solar cell.

Therefore, there is a need for a composition for solar cell electrodes that can secure excellent open circuit voltage and short circuit current density so as to improve conversion efficiency of solar cells.

DISCLOSURE

Technical Problem

It is one aspect of the present invention to provide a composition for solar cell electrodes, which has high open circuit voltage and short circuit current density.

It is another aspect of the present invention to provide a composition for solar cell electrodes, which has excellent conversion efficiency and fill factor.

The above and other aspect and features of the present invention can be accomplished by the present invention described hereinafter.

Technical Solution

In accordance with one aspect of the present invention, a composition for solar cell electrodes includes: silver powder; glass frits; and an organic vehicle, wherein the glass frits have a glass transition temperature of about 100° C. to about 300° C. and exhibit an exothermic peak starting temperature of about 200° C. to about 400° C. on a DTA curve in Thermogravimetry-Differential Thermal Analysis (TG-DTA) analysis.

The glass frits may be leaded glass frits.

The glass frits may include at least one of Pb—Bi—Te—O-based glass frits and an Ag—V—Pb—O-based glass frits.

The Pb—Bi—Te—O-based glass frits may include about 10 wt % to about 70 wt % of lead oxide (PbO), about 1 wt % to about 20 wt % of bismuth oxide ($Bi_2O_3$), and about 10 wt % to about 70 wt % of tellurium oxide ($TeO_2$); and the Ag—V—Pb—O-based glass frits may include about 10 wt % to about 60 wt % of silver oxide ($Ag_2O$), about 10 wt % to about 40 wt % of vanadium oxide ($V_2O_5$), and about 10 wt % to about 60 wt % of lead oxide (PbO).

The glass frits may further include at least one metal oxide selected from the group consisting of silicon oxide ($SiO_2$), barium oxide (BaO), vanadium oxide ($V_2O_5$), phosphorus oxide ($P_2O_5$), magnesium oxide (MgO), cerium oxide ($CeO_2$), boron oxide ($B_2O_3$), strontium oxide (SrO), molybdenum oxide ($MoO_3$), titanium oxide ($TiO_2$), tin oxide (SnO), indium oxide ($In_2O_3$), nickel oxide (NiO), copper oxide ($Cu_2O$ or CuO), antimony oxide ($Sb_2O_3$, $Sb_2O_4$, or $Sb_2O_5$), germanium oxide ($GeO_2$), gallium oxide ($Ga_2O_3$), calcium oxide (CaO), arsenic oxide ($As_2O_3$), cobalt oxide (CoO or $Co_2O_3$), zirconium oxide ($ZrO_2$), manganese oxide (MnO, $Mn_2O_3$, or $Mn_3O_4$), neodymium oxide ($Nd_2O_3$), tungsten oxide ($WO_3$), chromium oxide ($Cr_2O_3$), and aluminum oxide ($Al_2O_3$).

The composition for solar cell electrodes may include about 60 wt % to about 95 wt % of the silver powder; about 0.5 wt % to about 20 wt % of the glass frit; and about 1 wt % to about 30 wt % of the organic vehicle.

The glass frits may have an average particle diameter (D50) of about 0.1 μm to about 10 μm.

The composition may further include at least one additive selected from the group consisting of dispersants, thixotropic agents, plasticizers, viscosity stabilizers, anti-foaming agents, pigments, UV stabilizers, antioxidants, and coupling agents.

In accordance with another aspect of the present invention, a solar cell electrode formed of the composition for solar cell electrodes is provided.

Advantageous Effects

A solar cell electrode formed of the composition for solar cell electrodes according to embodiments of the present invention, has high open circuit voltage and short circuit current density, thereby can exhibit excellent conversion efficiency and fill factor.

DESCRIPTION OF DRAWINGS

FIG. 1 illustrates a schematic view of a solar cell structure in accordance with one embodiment of the present invention.

FIG. 2 illustrates a graph showing a DTA curve obtained by TG-DTA analysis of glass frits.

BEST MODE

Composition for Solar Cell Electrodes

The present invention relates to a composition for solar cell electrodes which includes silver powder; glass frits; and an organic vehicle. The glass frits have a glass transition temperature of about 100° C. to about 300° C. and exhibit an exothermic peak starting temperature of about 200° C. to about 400° C. on a DTA curve in Thermogravimetry-Differential Thermal Analysis (TG-DTA) analysis.

A solar cell electrode fabricated using the composition for solar cell electrodes according to embodiments of the present invention, has high open circuit voltage and short circuit current density, thereby providing excellent conversion efficiency and fill factor.

Now, the present invention will be described in more detail.

(A) Silver Powder

The composition for solar cell electrodes according to the invention includes silver (Ag) powder as a conductive powder. The particle size of the silver powder may be on a nanometer scale or micrometer scale. For example, the silver powder may have a particle size of dozens to several hundred nanometers, or several to dozens of micrometers. Alternatively, the silver powder may be a mixture of two or more types of silver powders having different particle sizes.

The silver powder may have a spherical, flake or amorphous shape.

The silver powder specifically has an average particle diameter D50 of about 0.1 μm to about 10 μm, more specifically about 0.5 μm to about 5 μm. The average particle diameter of the silver powder may be measured using, for example, a particle size analyzer Model 1064D (CILAS Co., Ltd.) after dispersing the silver powder in isopropyl alcohol (IPA) at 25° C. for 3 minutes via ultrasonication. Within this range of average particle diameter, the composition can provide low contact resistance and low line resistance.

The silver powder may be present in an amount of about 60 wt % to about 95 wt % based on the total weight of the composition. Within this range, the conductive powder can prevent deterioration in conversion efficiency due to increase in resistance. Specifically, the silver powder may be present in an amount of about 70 wt % to about 90 wt %.

(B) Glass Frit

The glass frits may generate silver crystal grains in an emitter region by etching an anti-reflection layer and melting the silver powder so as to reduce contact resistance during the baking process of the composition for electrodes. Further, the glass frits serve to enhance adhesion between the conductive powder and the wafer and are softened to decrease the baking temperature during the baking process.

When the area of the solar cell is increased in order to improve efficiency or fill factor of the solar cell, a contact resistance of the solar cell may increase. Thus, it is necessary to minimize both serial resistance and influence on the p-n junction. In addition, as the baking temperatures varies within a broad range with increasing use of various wafers having different sheet resistances, it is desirable that the glass frits secure sufficient thermal stability to withstand a wide range of baking temperatures.

The glass frits according to the present invention may be low melting point glass frits. The crystalline low melting point glass frits may have a glass transition temperature of about 100° C. to about 300° C.

The glass frits may exhibit an exothermic peak starting temperature of about 200° C. to about 400° C. on a DTA curve in TG-DTA analysis. The exothermic peak starting temperature refers to a temperature at which an exothermic peak appears for the first time. There may be one or more exothermic peaks. When a plurality of exothermic peaks appears on the DTA curve, a first exothermic peak may appear in the range of about 200° C. to about 400° C. FIG. 2 is a graph showing a DTA curve obtained by TG-DTA analysis of glass frits according to one embodiment of the present invention, and shows, by way of example, an exothermic peak starting temperature of 283.5° C. on the DTA curve.

In TG-DTA analysis, each of endothermic and exothermic temperatures may be measured through an exothermic or endothermic peak which appears on the DTA curve when the glass frits is heated to 600° C. at a heating rate of 20° C./min.

The glass frits may be, for example, leaded glass frits. Then, the composition can secure excellent conversion efficiency.

The glass frits may be, for example, crystalline low melting glass frits. Then, the composition can ensure excellent adhesive strength with respect to ribbons.

For example, the glass frits may be Pb—Bi—Te—O-based glass frits. The Pb—Bi—Te—O-based glass frits may include about 10 wt % to about 70 wt % of lead oxide (PbO), about 1 wt % to about 20 wt % of bismuth oxide ($Bi_2O_3$), and about 10 wt % to about 70 wt % of tellurium oxide ($TeO_2$). In one embodiment, the Pb—Bi—Te—O-based glass frits may include about 25 wt % to about 50 wt % of lead oxide (PbO), about 5 wt % to about 20 wt % of bismuth oxide ($Bi_2O_3$), and about 35 wt % to about 65 wt % of tellurium oxide ($TeO_2$). In specific example, a weight ratio of the lead oxide (PbO) to the tellurium oxide ($TeO_2$) may be about 1:1.3 to about 1:2. Within this range, the composition can ensure excellent conversion efficiency and adhesive strength with respect to a ribbon.

For other example, the glass frits may include Ag—V—Pb—O-based glass frits. The Ag—V—Pb—O-based glass frits may include about 10 wt % to about 60 wt % of silver oxide ($Ag_2O$), about 10 wt % to about 40 wt % of vanadium oxide ($V_2O_5$), and about 10 wt % to about 60 wt % of lead oxide (PbO). In one embodiment, the Ag—V—Pb—O-based glass frits may include about 20 wt % to about 45 wt % of silver oxide ($Ag_2O$), about 10 wt % to about 30 wt % of vanadium oxide ($V_2O_5$), and about 40 wt % to about 60 wt % of lead oxide (PbO). In specific example, a weight ratio of the silver oxide ($Ag_2O$) to the vanadium oxide ($V_2O_5$) may be about 1.5:1 to about 3:1. Within this range, the composition can ensure excellent conversion efficiency and adhesive strength with respect to a ribbon.

The glass flits may fluffier include at least one metal oxide selected from the group consisting of silicon oxide ($SiO_2$), barium oxide (BaO), vanadium oxide ($V_2O_5$), phosphorus oxide ($P_2O_5$), magnesium oxide (MgO), cerium oxide ($CeO_2$), boron oxide ($B_2O_3$), strontium oxide (SrO), molybdenum oxide ($MoO_3$), titanium oxide ($TiO_2$), tin oxide (SnO), indium oxide ($In_2O_3$), nickel oxide (NiO), copper oxide ($Cu_2O$ or CuO), antimony oxide ($Sb_2O_3$, $Sb_2O_4$, or $Sb_2O_5$), germanium oxide ($GeO_2$), gallium oxide ($Ga_2O_3$), calcium oxide (CaO), arsenic oxide ($As_2O_3$), cobalt oxide (CoO or $Co_2O_3$), zirconium oxide ($ZrO_2$), manganese oxide (MnO, $Mn_2O_3$, or $Mn_3O_4$), neodymium oxide ($Nd_2O_3$), tungsten oxide ($WO_3$), chromium oxide ($Cr_2O_3$), and aluminum oxide ($Al_2O_3$).

The glass frits may be prepared from such metal oxides by any typical method known in the art. For example, the metal oxides may be mixed in a predetermined ratio. Mixing may be carried out using a ball mill or a planetary mill. The mixture is melted at about 900° C. to about 1300° C., followed by quenching to 25° C. The obtained resultant is subjected to pulverization using a disc mill, a planetary mill, or the like, thereby preparing glass frits.

The glass frits may have an average particle diameter (D50) of about 0.1 μm to about 10 μm. Within this range, the composition can further reduce resistance.

The glass frits may be present in an amount of about 0.5 wt % to about 20 wt %, specifically about 0.5 wt % to about 5 wt %, based on the total weight of the composition. Within this range, the glass frits can enhance adhesion between the conductive powder and a wafer, and during the baking process, can soften and decrease the baking temperature.

The glass frits may have a spherical or amorphous shape.

(C) Organic Vehicle

The organic vehicle imparts suitable viscosity and rheological characteristics for printing to the composition for solar cell electrodes through mechanical mixing with the inorganic component of the composition.

The organic vehicle may be any typical organic vehicle used in solar cell electrode compositions, and may include a binder resin, a solvent, and the like.

Examples of the binder resin may include acrylate resins, cellulose resins and the like. Specifically, examples of the binder resin may include ethyl cellulose resins, ethyl hydroxyethyl cellulose resins, nitrocellulose resins, blends of ethyl cellulose and phenol resin, alkyd resins, phenolic resins, acrylate ester resins, xylene resins, polybutene resins, polyester resins, urea resins, melamine resins, vinyl acetate resins, wood rosins, polymethacrylates of alcohols, and the like, without being limited thereto.

The solvent, for example, may be include at least one or two more of hexane, toluene, ethyl cellosolve, cyclohexanone, butyl cellosolve, butyl carbitol (diethylene glycol monobutyl ether); glycol ether type solvent such as dibutyl carbitol (diethylene glycol dibutyl ether), propylene glycol monomethyl ether; butyl carbitol acetate (diethylene glycol monobutyl ether acetate), hexylene glycol, terpineol, methylethylketone, benzylalcohol, γ-butyrolactone, ethyl lactate, 3-pentanediol, 2,2,4-trimethyl monoisobutyrate (texanol), and combinations thereof.

The organic vehicle may be present in an amount of about 1 wt % to about 30 wt % based on the total weight of the composition. Within this range, the organic vehicle can provide sufficient adhesive strength and excellent printability to the composition.

(D) Additives

The composition may further include typical additives to enhance flow and process properties and stability, as needed. The additives may include dispersants, thixotropic agents, plasticizers, viscosity stabilizers, anti-foaming agents, pigments, UV stabilizers, antioxidants, coupling agents, and the like, without being limited thereto. These additives may be used alone or as mixtures thereof.

The amount of the additives in the composition may be changed as needed. The additives may be present in an amount of about 0.1 wt % to about 5 wt % based on the total weight of the composition, without being limited thereto. Within this range, the additive can further enhance properties of the glass frit.

Solar Cell Electrode and Solar Cell Including the Same

Other aspects of the invention relate to an electrode formed of the composition for solar cell electrodes and a solar cell including the same. FIG. 1 shows a solar cell in accordance with one embodiment of the invention.

Referring to FIG. 1, a rear electrode 210 and a front electrode 230 may be formed by printing and baking the composition on a wafer or substrate 100 that includes a p-layer 101 and an n-layer 102, which will serve as an emitter. For example, a preliminary process of preparing the rear electrode 210 is performed by printing the composition on the rear surface of the wafer 100 and drying the printed composition at about 200° C. to about 400° C. for about 10 seconds to about 60 seconds. Further, a preliminary process for preparing the front electrode may be performed by printing the paste on the front surface of the wafer and drying the printed composition. Then, the front electrode 230 and the rear electrode 210 may be formed by baking the wafer at about 400° C. to about 950° C., specifically at about 850° C. to about 950° C., for about 30 seconds to about 50 seconds.

Next, the present invention will be described in more detail with reference to examples. However, it should be noted that these examples are provided for illustration only and should not be construed in any way as limiting the invention.

EXAMPLES

Example 1

Metal oxides were mixed according to the composition listed in Table 1 and subjected to melting and sintering at 900° C. to 1300° C., thereby preparing glass frits I having an average particle diameter (D50) of 1.0 μm. The glass frits have a glass transition temperature of 280° C. and exhibit a first exothermic peak at 302° C. on a DTA curve in TG-DTA analysis.

As an organic binder, 0.2 wt % of ethylcellulose (STD4, Dow Chemical Company) was sufficiently dissolved in 5 wt % of butyl carbitol at 60° C., and 89 wt % of spherical silver powder (AG-2.5-11F, Dowa Hightech Co. Ltd.) having an average particle diameter of 1.2 μm, 1 wt % of the glass frits I, 3 wt % of a plasticizer Benzoflex 9-88 (Eastman Co., Ltd.), 0.7 wt % of a dispersant BYK102 (BYK-chemie), and 1.1 wt % of a thixotropic agent Thixatrol ST (Elementis Co., Ltd.) were added to the binder solution, followed by mixing and kneading in a 3-roll kneader, thereby preparing a composition for solar cell electrodes.

Evaluation of Properties

Fill Factor, Short Circuit Current Density, Open Circuit Voltage, and Conversion Efficiency:

A p-type polycrystalline wafer was subjected to texturing with acid or base, and then formed with an n-type emitter by dispersing phosphorus, followed by PECVD to form a silicon nitride-based anti-reflection film thereon. Then, the prepared composition for solar cell electrodes was deposited over a front surface of the wafer by screen-printing in a predetermined pattern, followed by drying in an IR drying furnace. Then, an aluminum paste was printed on a rear side of the wafer and dried in the same manlier as above. Cells formed according to this procedure were subjected to baking at 400° C. to 900° C. for 30 seconds to 50 seconds in a belt-type baking furnace, and evaluated as to fill factor (F.F.), short circuit current density (Jsc), open circuit voltage (Voc), and conversion efficiency (Eff., %) using a solar cell efficiency tester CT-801 (Pasan Co., Ltd.). Results are shown in Table 1.

TG-DTA Analysis of Glass Frits:

The glass frits were measured as to exothermic peak starting temperature on a DTA curve while being heated to 600° C. at a heating rate of 20° C./min, using an aluminum pan P/N SSC515D001 (EXSTAR Co., Ltd.) and an EXSTAR 6200. Results are shown in Table 1.

Examples 2 to 8 and Comparative Examples 1 to 3

Compositions for solar cell electrodes were prepared in the same manner as in Example 1 except that the compositions were prepared in amounts as listed in Tables 2 and 3. The composition, glass transition temperature, and exothermic peak starting temperature on a DTA curve in TG-DTA analysis of each of the glass frits I to V used in Examples 2 to 8 and Comparative Examples 1 to 3 are shown in Table 1.

TABLE 1

| | Composition of glass frits (unit: wt %) | | | | | | | | | | Glass transition temperature (° C.) | exothermic peak starting temperature on DTA curve (° C.) |
|---|---|---|---|---|---|---|---|---|---|---|---|---|
| | PbO | TeO$_2$ | Bi$_2$O$_3$ | Ag$_2$O | V$_2$O$_5$ | Li$_2$O | SiO$_2$ | Al$_2$O$_3$ | ZnO | Na$_2$O | | |
| Glass frit I | 31 | 56 | 13 | — | — | — | — | — | — | — | 280 | 302 |
| Glass frit II | 55 | — | — | 32 | 13 | — | — | — | — | — | 280 | 294 |
| Glass frit III | 89 | — | 2 | — | — | — | 7 | 2 | — | — | 290 | — |
| Glass frit IV | 68 | — | — | — | — | 2 | 16 | 5 | 8 | 1 | 435 | 486 |
| Glass frit V | 55 | — | — | — | — | — | 31 | 7 | 7 | — | 435 | 501 |

TABLE 2

| (unit: wt %) | | Example 1 | Example 2 | Example 3 | Example 4 | Example 5 | Example 6 | Example 7 | Example 8 |
|---|---|---|---|---|---|---|---|---|---|
| Silver (kg) powder | | 89 | 89 | 89 | 89 | 89 | 89 | 89 | 89 |
| Glass frit | I | 1 | 2 | 3 | 5 | — | — | — | — |
| | II | — | — | — | — | 1 | 2 | 3 | 5 |
| | III | — | — | — | — | — | — | — | — |
| | IV | — | — | — | — | — | — | — | — |
| | V | — | — | — | — | — | — | — | — |
| Organic vehicle Additive | Binder | 0.2 | 0.2 | 0.2 | 0.1 | 0.2 | 0.2 | 0.2 | 0.1 |
| | Solvent | 5 | 5 | 4.7 | 4 | 5 | 5 | 4.7 | 4 |
| | Plasticizer | 3 | 2.5 | 2 | 1 | 3 | 2.5 | 2 | 1 |
| | Dispersant | 0.7 | 0.7 | 0.7 | 0.7 | 0.7 | 0.7 | 0.7 | 0.7 |
| | Thixotropic agent | 1.1 | 0.6 | 0.4 | 0.2 | 1.1 | 0.6 | 0.4 | 0.2 |
| Fill Factor (%) | | 0.767 | 0.764 | 0.765 | 0.765 | 0.720 | 0.750 | 0.740 | 0.700 |
| Jsc (mA/cm$^2$) | | 0.034 | 0.034 | 0.034 | 0.034 | 0.034 | 0.034 | 0.034 | 0.034 |
| Voc (mV) | | 616 | 615 | 615 | 614 | 616 | 615 | 615 | 614 |
| Efficiency (%) | | 16.11 | 16.02 | 16.03 | 16.10 | 15.12 | 15.73 | 15.52 | 14.74 |

TABLE 3

| (unit: wt %) | | Comparative Example 1 | Comparative Example 2 | Comparative Example 3 |
|---|---|---|---|---|
| Silver (Ag) powder | | 89 | 89 | 89 |
| Glass frit | I | — | — | — |
| | II | — | — | — |
| | III | 2 | — | — |
| | IV | — | 2 | — |
| | V | — | — | 2 |
| Organic vehicle Additive | Binder | 0.2 | 0.2 | 0.2 |
| | Solvent | 5 | 5 | 5 |
| | Plasticizer | 2.5 | 2.5 | 2.5 |
| | Dispersant | 0.7 | 0.7 | 0.7 |
| | Thixotropic agent | 0.6 | 0.6 | 0.6 |
| Fill Factor (%) | | 0.282 | 0.274 | 0.690 |
| Jsc (mA/cm2) | | 0.031 | 0.032 | 0.034 |
| Voc (mV) | | 598 | 608 | 612 |
| Efficiency (%) | | 10.20 | 13.40 | 14.43 |

As shown in Tables 2 and 3, it was ascertained that Examples in which the low melting point glass frits I and II having a glass transition temperature of 100° C. to 300° C. and an exothermic peak starting temperature of 200° C. to 400° C., had excellent conversion efficiency and fill factor, as compared with those of Comparative Example 1, in which the glass frits III having a glass transition temperature satisfying the present invention while not exhibiting an exothermic peak starting temperature within the range of 200° C. to 400° C. was used, and Comparative Examples 2 to 3, in which the high melting glass frits IV and V having a glass transition temperature higher than 300° C. were used.

Although some embodiments have been described, it will be apparent to those skilled in the art that these embodiments are given by way of illustration only, and that various modifications, changes, alterations, and equivalent embodiments can be made without departing from the spirit and scope of the invention. The scope of the invention should be limited only by the accompanying claims and equivalents thereof.

The invention claimed is:

1. A composition for solar cell electrodes, the composition comprising:
   silver powder;
   glass frit that is free of boron oxide; and
   an organic vehicle,
   wherein the glass frit:
   has a glass transition temperature of about 100° C. to less than 300° C., and
   exhibits an exothermic peak starting temperature of about 200° C. to about 400° C. on a DTA curve in TG-DTA analysis,
   wherein the glass frit includes a Pb—Bi—Te—O-based glass frit that does not include vanadium oxide and that includes:
   greater than 30 wt % to about 70 wt % of lead oxide,
   greater than 10 wt % to about 20 wt % of bismuth oxide, and
   about 10 wt % to less than 60 wt % of tellurium oxide, and
   wherein a weight ratio of the lead oxide to the tellurium oxide is about 1:1.3 to less than 1:2.

2. The composition according to claim 1, wherein the glass frit further includes at least one oxide selected from silicon oxide, barium oxide, phosphorus oxide, magnesium oxide, cerium oxide, strontium oxide, molybdenum oxide, titanium oxide, tin oxide, indium oxide, nickel oxide, copper oxide, antimony oxide, germanium oxide, gallium oxide, calcium oxide, arsenic oxide, cobalt oxide, zirconium oxide, manganese oxide, neodymium oxide, tungsten oxide, chromium oxide, and aluminum oxide.

3. The composition according to claim 1, wherein the composition includes:
   about 60 wt % to about 95 wt % of the silver powder;
   about 0.5 wt % to about 20 wt % of the glass fit; and
   about 1 wt % to about 30 wt % of the organic vehicle.

4. The composition according to claim 1, wherein the glass frit has an average particle diameter (D50) of about 0.1 μm to about 10 μm.

5. The composition according to claim 1, further comprising: at least one additive selected from dispersants, thixotropic agents, plasticizers, viscosity stabilizers, antifoaming agents, pigments, UV stabilizers, antioxidants, and coupling agents.

6. A solar cell electrode prepared from the composition for solar cell electrodes according to claim 1.

\* \* \* \* \*